(12) United States Patent
Chen et al.

(10) Patent No.: US 10,663,795 B1
(45) Date of Patent: May 26, 2020

(54) DISPLAY DEVICE AND MANUFACTURING METHOD THEREOF

(71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Yin-Cheng Chen, Guangdong (CN); Wen-Hsiao Huang, Guangdong (CN); Ta-Jen Huang, Guangdong (CN)

(73) Assignees: INTERFACE TECHNOLOGY (CHENGDU) CO., LTD., Sichuan (CN); INTERFACE OPTOELECTRONICS (SHENZHEN) CO., LTD., Guangdong (CN); GENERAL INTERFACE SOLUTION LIMITED, Miaoli County (TW)

( * ) Notice: Subject to any disclaimer, the term of this patent is extended or adjusted under 35 U.S.C. 154(b) by 0 days.

(21) Appl. No.: 16/239,559

(22) Filed: Jan. 4, 2019

(30) Foreign Application Priority Data

Dec. 7, 2018 (CN) .......................... 2018 1 1494600

(51) Int. Cl.
*G02F 1/13357* (2006.01)
*G02F 1/1333* (2006.01)

(52) U.S. Cl.
CPC .. *G02F 1/133603* (2013.01); *G02F 1/133305* (2013.01); *G02F 1/133606* (2013.01); *G02F 1/133611* (2013.01); *G02F 1/133621* (2013.01); *G02F 2001/133354* (2013.01); *G02F 2001/133624* (2013.01)

(58) Field of Classification Search
None
See application file for complete search history.

(56) References Cited

U.S. PATENT DOCUMENTS

| | | | |
|---|---|---|---|
| 8,016,450 B2* | 9/2011 | Shinkai | G02B 3/0006 362/607 |
| 8,210,701 B2* | 7/2012 | Igarashi | G02F 1/133603 362/97.1 |
| 10,014,449 B1* | 7/2018 | Morikawa | H01L 33/504 |
| 2011/0242796 A1* | 10/2011 | Yang | C09J 11/02 362/97.1 |
| 2011/0248287 A1* | 10/2011 | Yuan | H01L 33/60 257/88 |
| 2012/0250350 A1* | 10/2012 | Kim | G02F 1/133603 362/606 |
| 2014/0021493 A1* | 1/2014 | Andrews | H01L 33/60 257/88 |
| 2014/0217433 A1* | 8/2014 | Tudorica | H01L 25/0753 257/89 |
| 2019/0265549 A1* | 8/2019 | Chen | G02F 1/133606 |

* cited by examiner

*Primary Examiner* — Britt D Hanley
(74) *Attorney, Agent, or Firm* — CKC & Partners Co., LLC

(57) ABSTRACT

A display device includes a substrate, a plurality of light emitters, a colloid, an optical film, and a liquid crystal panel. The light emitters are located on a surface of the substrate. There are a plurality of gaps between the light emitters. The colloid is located in the gaps on the surface of the substrate and surrounds the light emitters. The optical film is located above the colloid and the light emitters. The liquid crystal panel is located above the optical film.

8 Claims, 5 Drawing Sheets

DISPLAY DEVICE AND MANUFACTURING METHOD THEREOF

RELATED APPLICATIONS

This application claims priority to China Application Serial Number 201811494600.2, filed Dec. 7, 2018, which is herein incorporated by reference.

BACKGROUND

Field of Invention

The present disclosure relates to a display device and a manufacturing method of the display device.

Description of Related Art

In the field of display devices, mini light-emitting diodes (Mini LEDs) can be used as backlights for the liquid crystal screen. In order to increase the brightness of the display device, a direct back-lit light source may be used to replace the edge back-lit light source. The wavelength of the light-emitting diode chip in the mini light-emitting diode can be converted by fluorescent powder. For example, the blue light of a blue light-emitting diode chip may be mixed with the yellow light of a yellow fluorescent powder to be converted into white light. The packaging method of a module structure combining the light-emitting diode chip and the fluorescent powder can be divided into two types: chip on board (COB) and chip size package (CSP).

Although reducing the optical distance in the display device contributes to thinning the display device, and since the optical distance is smaller, the positions of liquid crystal panel corresponding to the LED chips have greater brightness; therefore, it is simple to cause a situation in which the brightness of the display panel is uneven.

SUMMARY

An aspect of the present disclosure is to provide a display device.

According to an embodiment of the present disclosure, a display device includes a substrate, a plurality of light emitters, a colloid, an optical film, and a liquid crystal panel. The light emitters are located on a surface of the substrate. There are a plurality of gaps between the light emitters. The colloid is located in the gaps on the surface of the substrate and surrounds the light emitters. The optical film is located above the colloid and the light emitters. The liquid crystal panel is located above the optical film.

In an embodiment of the present disclosure, an optical distance in a range from 0 mm to 1 mm is between the optical film and the light emitters.

In an embodiment of the present disclosure, the display device further includes a flexible circuit board. The flexible circuit board is located on the substrate and electrically connected to the light emitters.

In an embodiment of the present disclosure, the light emitter includes a light-emitting chip and a wavelength conversion layer covering the light-emitting chip.

In an embodiment of the present disclosure, the wavelength conversion layer extends to the sidewall of the light-emitting chip, and is located between the light-emitting chip and the colloid.

In an embodiment of the present disclosure, the colloid includes a plurality of optical particles and an optical adhesive. The material of the optical particles includes silicon or epoxy resin. The particle diameter of the optical particles is in a range from 5 μm to 10 μm, and the weight percentage concentration of the optical particles is in a range from 25% to 30%. The material of the optical adhesive includes silicon or poly(methyl methacrylate).

An aspect of the present disclosure is to provide a manufacturing method of a display device.

According to an embodiment of the present disclosure, a manufacturing method of a display device includes the following steps of: mixing a plurality of optical particles with an optical adhesive to form a colloid; coating the colloid in a plurality of gaps between a plurality of light emitters on a surface of a substrate, such that the colloid surrounds the light emitters; disposing an optical film above the colloid and the light emitters; and disposing a liquid crystal panel above the optical film.

In an embodiment of the present disclosure, further includes packaging a plurality of light-emitting chips with a plurality of wavelength conversion layers to form the light emitters; and connecting the light emitters to a flexible circuit board.

In an embodiment of the present disclosure, the material of the optical particles includes silicon or epoxy resin, and the material of the optical adhesive includes silicon or poly(methyl methacrylate).

In an embodiment of the present disclosure, the particle diameter of the optical particles is in a range from 5 μm to 10 μm, and the weight percentage concentration of the optical particles is in a range from 25% to 30%.

In the aforementioned embodiments of the present disclosure, since the optical particles of a material including silicon or epoxy resin are first uniformly mixed with the optical adhesive including silicon or poly(methyl methacrylate) at a suitable ratio to form the colloid having a function of light diffusion. Subsequently, the colloid including the optical particles is coated on the surface of the substrate, such that the colloid is sufficiently filled in the gaps between the light emitters, so that the areas between the light emitters that cannot emit light can reflect the light of the light emitters by being filled with the colloid. This leads to forming a continuous light-emitting area to achieve the function of light diffusion. Therefore, when the optical distance is reduced, the situation in which the brightness of the liquid crystal panel is uneven due to the high brightness of the areas of the liquid crystal panel corresponding to the light-emitting range of the light-emitting chip is not caused. In this way, when the optical distance is reduced to a range from 0 mm to 1 mm, the brightness uniformity of the liquid crystal panel can be maintained to successfully achieve the purpose of thinning the display device.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
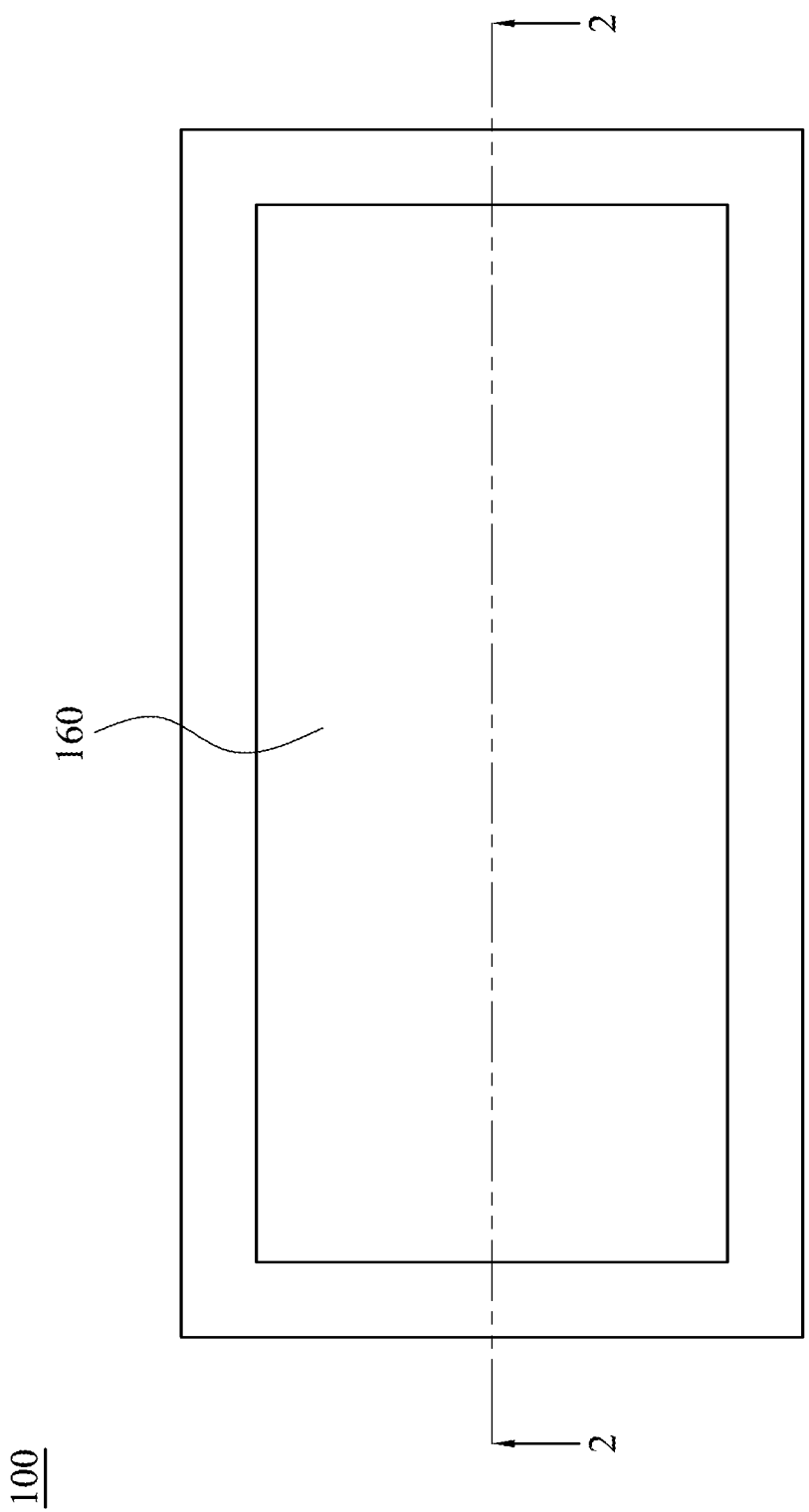
FIG. 1 illustrates a top view of a display device according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
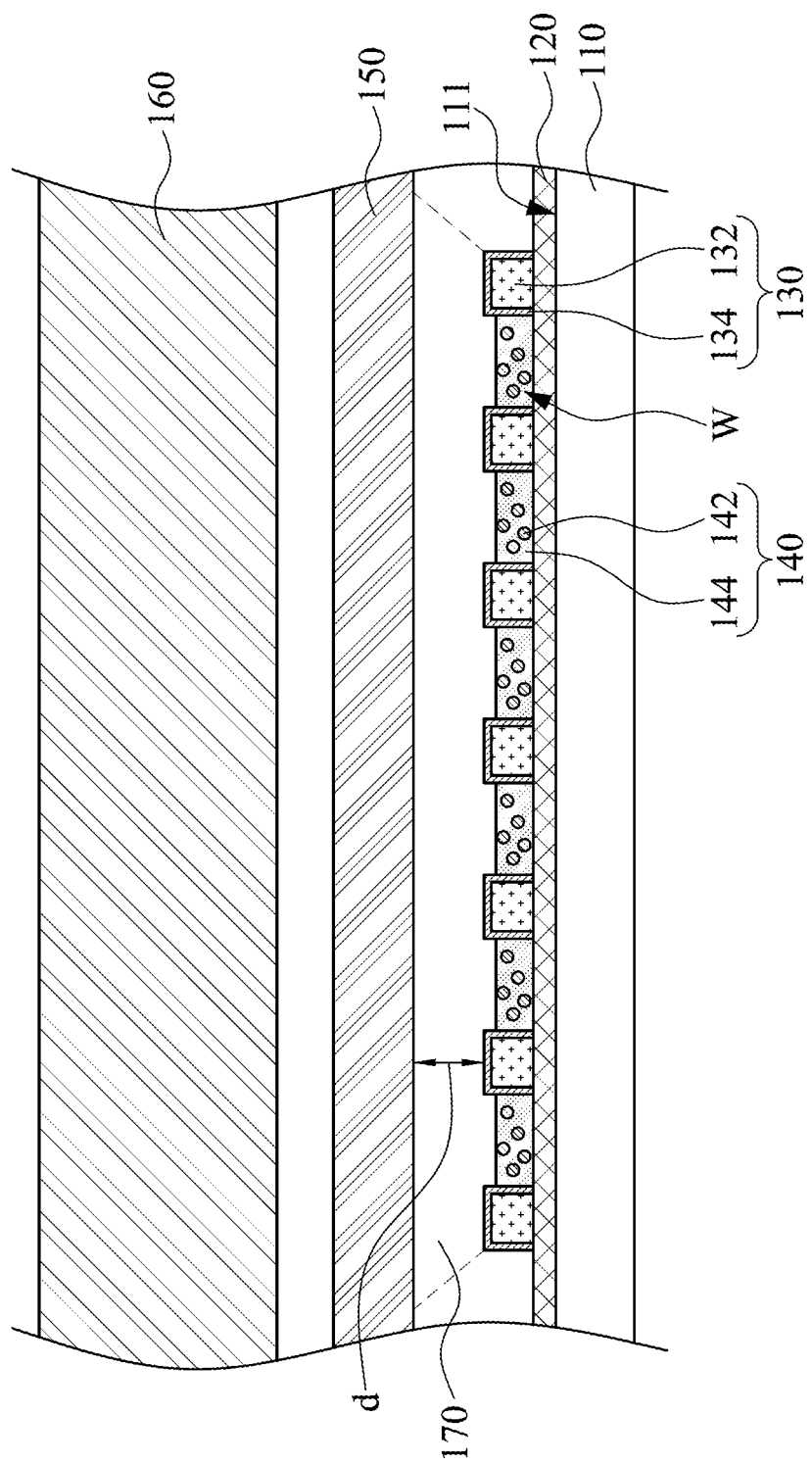
FIG. 2 illustrates a cross-sectional view of the display device taken along line 2-2 shown in FIG. 1.

FIG. 1 illustrates a top view of a display device according to an embodiment of the present disclosure. FIG. 2 illustrates a cross-sectional view of the display device taken along line 2-2 shown in FIG. 1. As shown in FIG. 2, a display device 100 includes a substrate 110, a plurality of light emitters 130, a colloid 140, an optical film 150, and a liquid crystal panel 160. The light emitters 130 are located on a surface 111 of the substrate 110. There are a plurality of gaps W between the adjacent light emitters 130. The colloid 140 is located in the gaps W on the surface 111 of the substrate 110 and surrounds the light emitters 130. The optical film 150 is located above the light emitters 130. The liquid crystal panel 160 is located above the optical film 150.

In the present embodiment, the light emitters 130 are backlight sources of the liquid crystal panel 160, such as direct back-lit light sources, and the light provided by the light emitters 130 can sequentially pass through the optical film 150 and the liquid crystal panel 160. In the condition without the colloid 140, the light emitted by each of the light emitters 130 may form a radial light-emitting range, and the light-emitting range formed by each of the light emitters 130 and the light-emitting ranges formed by the adjacent light emitters 130 overlap as the light is gradually away from the light emitters 130.

Therefore, in the condition without the colloid 140, there are two kinds of areas near the light emitters 130, one is the dark areas where the light-emitting ranges do not overlap, and the other is the bright areas where light-emitting ranges overlap. These two kinds of areas are staggered with each other.

In order to improve the brightness uniformity of the display device 100 and reduce the optical distance d between the light emitters 130 and the optical film 150, the gaps W between the light emitters 130 on the surface 111 of the substrate 110 is filled with the colloids 140 for the display device 100, such that the area between the light emitters 130 that is originally unable to emit light (i.e., the gaps W) can reflect the light of the light emitters 130 in the direction to the liquid crystal panel 160 by being filled with the colloid 140. This leads to forming the continuous light-emitting area as shown in FIG. 2 to further achieve the function of light diffusion, and to thin the display device 100.

In the present embodiment, by filling the colloids 140 in the gaps W between the light emitters 130, and reducing the optical distance d to a range between 0 mm and 1 mm, the brightness uniformity of the liquid crystal panel 160 can be increased from 30% (i.e., the condition without filling the colloids 140) to more than 67% (i.e., the condition filling the colloids 140).

Figure 3:
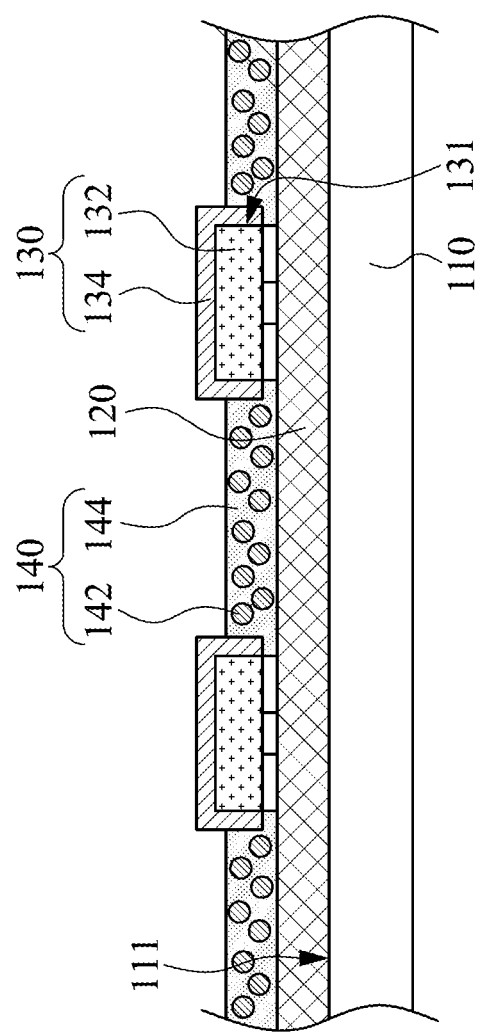
FIG. 3 illustrates a partial enlargement diagram of the display device shown in FIG. 2.

FIG. 3 illustrates a partial enlargement diagram of the display device 100 shown in FIG. 2. As shown in FIG. 3, the display device 100 further includes a flexible circuit board 120 on the substrate 110. The flexible circuit board 120 is electrically connected to the light emitters 130 to provide the circuit configuration. Each of the light emitters 130 includes a light-emitting chip 132 and a wavelength conversion layer 134 covering the light-emitting chip 132. In the present embodiment, the substrate 110 may be a stiffener made of a metal material such as SUS304, but the present disclosure is not limited to SUS304 in this regard. In other embodiments, the substrate 110 can be a printed circuit board (PCB) in which the flexible circuit board 120 is omitted.

In this embodiment, the light-emitting chip 132 may be a mini light-emitting diode chip (Mini LED), such as a blue light-emitting chip, and the size thereof may be in a range from 100 μm to 200 μm. The wavelength conversion layer 134 may be fluorescent powder, such as the yellow fluorescent powder, but the present disclosure is not limited in this regard. The light wavelength of the light-emitting chip 132 can be converted by the wavelength conversion layer 134. In an embodiment, the blue light generated by the blue light-emitting chip can be converted into white light by the yellow fluorescent powder. In the present embodiment, the light-emitting chip 132 and the wavelength conversion layer 134 are first packaged by the method of chip size package (CSP) before being connected to the flexible circuit board 120. The substrate 110, the flexible circuit board 120, and the light emitters 130 can be regarded as a light board.

In addition, the wavelength conversion layer 134 of the light emitter 130 further extends to the sidewall 131 of the light-emitting chip 132, such that a portion of the wavelength converting layer 134 is located between the light-emitting chip 132 and the colloid 140. Such a design may allow the wavelength conversion layer 134 to simultaneously contact the light-emitting chip 132 and the colloid 140 to ensure that the wavelength of the light emitted by the sidewall 131 of the light-emitting chip 132 is first converted by the wavelength conversion layer 134 before being transmitted to the colloid 140 for diffusion. For example, the blue light emitted from the sidewall 131 of the blue light-emitting chip 132 is first converted into white light through the yellow wavelength conversion layer 134 before entering the colloid 140 for light diffusion. In the present embodiment, the top surface of the colloid 140 is lower than the top surface of the light emitters 130, but the present disclosure is not limited in this regard.

In the present embodiment, the colloid 140 includes a plurality of optical particles 142 and an optical adhesive 144. The optical particles 142 and the optical adhesive 144 are uniformly mixed at a suitable ratio such that the weight percentage concentration of the optical particles 142 is in a range from 25% to 30%, and this can allow the colloid 140 to have a good function of light diffusion. The optical particles 142 may be fine particles of a material including silicon or epoxy resin, and the particle diameter of the optical particles 142 is in a range from 5 μm to 10 μm. The material of the optical adhesive 144 may include silicon or poly(methyl methacrylate) (PMMA), and the transmittance of the optical adhesive 144 may be in a range from 95% to 99%, but the present disclosure is not limited in this regard. In other embodiments, the materials of the optical particles 142 and the optical adhesive 144 may be various materials having light guiding properties as deemed necessary by designers.

It is to be noted that the connection relationships, the materials, and the advantages of the elements described above will not be repeated. In the following description, a manufacturing method of a display device will be described.

Figure 4:
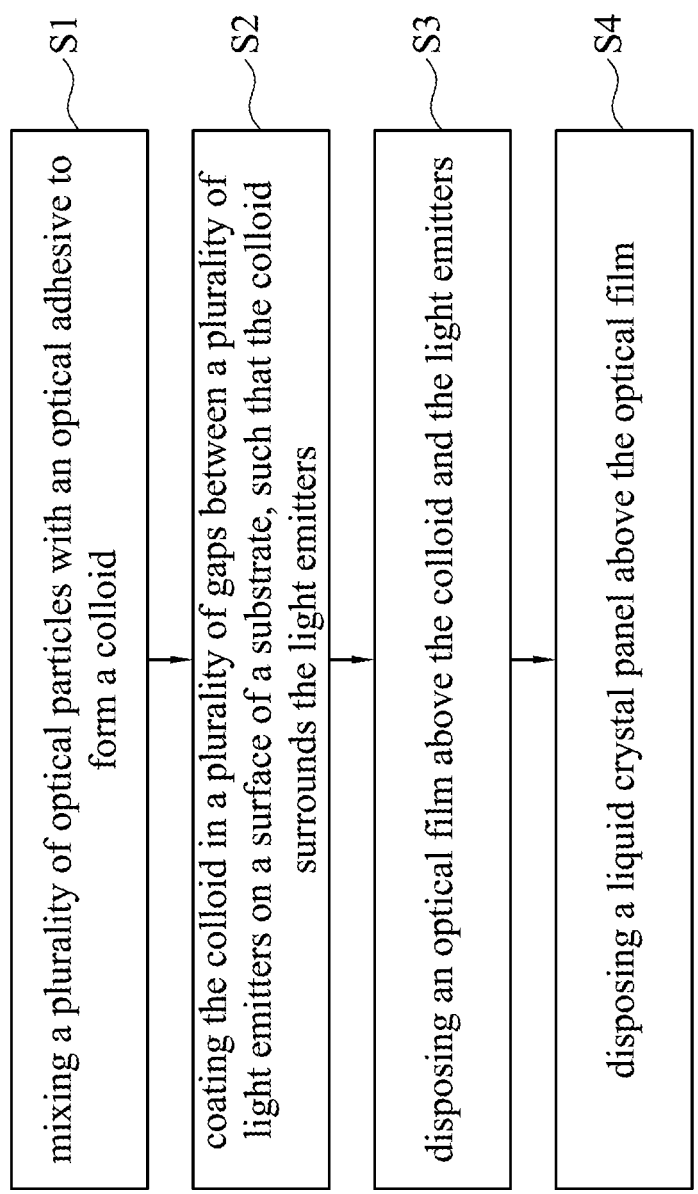
FIG. 4 illustrates a flow diagram of a display device according to an embodiment of the present disclosure.

FIG. 4 illustrates a flow diagram of a display device 100 according to an embodiment of the present disclosure. A manufacturing method of the display device 100 includes the following steps.

In step S1, a plurality of optical particles 142 are mixed with an optical adhesive 144 to form a colloid 140.

In step S2, a plurality of gaps W between a plurality of light emitters 130 on a surface 111 of a substrate 110 are coated by the colloid 140, such that the colloid surrounds the light emitters.

In step S3, an optical film 150 is disposed above the colloid 140 and the light emitters 130.

In step S4, a liquid crystal panel 160 is disposed above the optical film 150. The steps above will be further discussed below.

During the production of the display device 100 of FIG. 2, the substrate 110 may be provided first, and a flexible circuit board 120 having the light emitter 130 is disposed above the substrate 110. In the present embodiment, the light-emitting chip 132 and the wavelength conversion layer 134 may be first packaged by the method of chip size package (CSP) before being connected to the flexible circuit board 120. The substrate 110, the flexible circuit board 120, and the light emitters 130 can be regarded as a light board.

Figure 6:
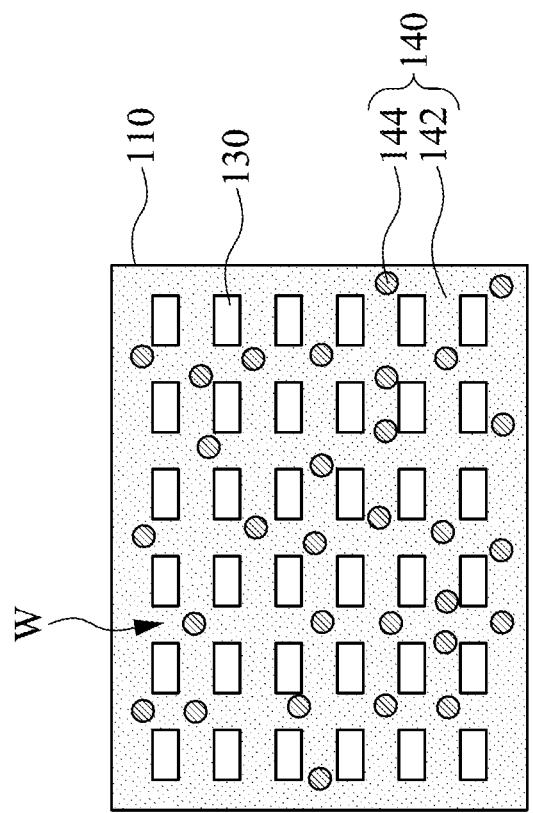
FIG. 5 and FIG. 6 illustrate schematic diagrams at specific stages of a manufacturing method of the display device according to an embodiment of the present disclosure.
Figure 5:
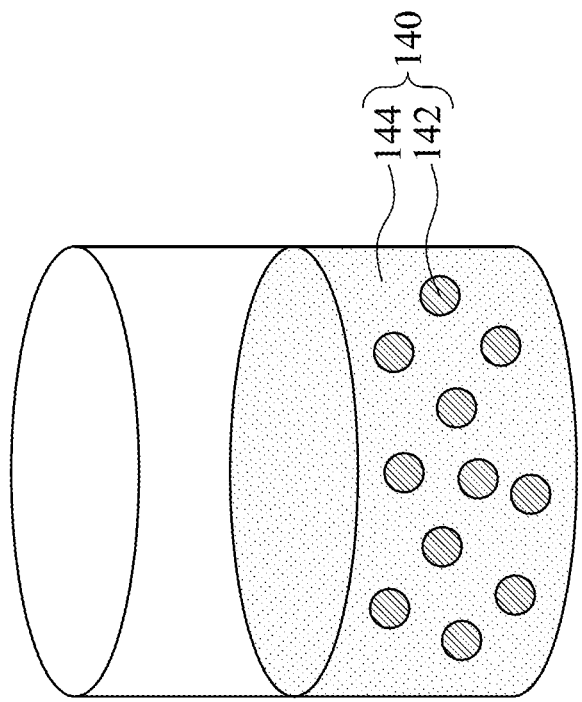

FIG. 5 and FIG. 6 illustrate schematic diagrams at specific stages of a manufacturing method of the display device according to an embodiment of the present disclosure. As shown in FIG. 6, after the light board having the substrate 110, the flexible circuit board 120, and the light emitters 130 is formed, the optical particles 142 and the optical adhesive 144 may be stirred and mixed uniformly to form the colloid 140. The weight percentage concentration of the optical particles 142 in the colloid 140 may be in a range from 25% to 30%.

In the present embodiment, the optical particles 142 may be fine particles of a material including silicon or epoxy resin, and the particle diameter of the optical particles 142 is in a range from 5 μm to 10 μm. The optical adhesive 144 may include silicon or poly(methyl methacrylate) (PMMA). In the present embodiment, the transmittance of the optical adhesive 144 may be in a range from 95% to 99%, but the present disclosure is not limited in this regard.

As shown in FIG. 6, after forming the colloid 140 of FIG. 5, the colloid 140 may be coated in a plurality of gaps W between a plurality of light emitters 130 on the surface 111 of the substrate 110, such that the colloid 140 surrounds the light emitters 130 but does not cover the top surface of the light emitters 130. Through the above steps, the structure of FIG. 3 can be obtained.

The optical film 150 is disposed above the colloid 140 and the light emitters 130 such that an optical distance d in a range from 0 mm to 1 mm is between the optical film 150 and the light emitters 130 as shown in FIG. 2. The liquid crystal panel 160 is disposed above the optical film 150 to form the display device 100 of FIG. 2. The display device 100 in the present embodiment can be applied to liquid crystal panel related products, such as an outdoor display screen, a television, a notebook, a desktop display, a vehicle display, a wearable device, or a mobile phone, but the present disclosure is not limited in this regard.

Since the optical particles 142 including a material of silicon or epoxy resin are uniformly mixed with the optical adhesive 144 including silicon or poly(methyl methacrylate) at a suitable ratio, the colloid 140 having a good function of light diffusion can be formed. Subsequently, the colloid 140 including the optical particles 142 is coated on the surface 111 of the substrate 110, and the colloid 140 is filled in the gaps W between the light emitters 130, such that the areas between the light emitters 130 that is unable to emit light (such as the gap W) can reflect the light of each of the light emitter 130 by being filled with the colloid 140. This leads to forming a continuous light-emitting area 170 (as shown in FIG. 2) to further achieve the function of light diffusion.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A display device, comprising:
   a substrate;
   a plurality of light emitters located on a surface of the substrate, wherein a plurality of gaps are between the light emitters, each of the light emitters comprises a light-emitting chip and a wavelength conversion layer covering the light-emitting chip, and the wavelength conversion layer extends to a sidewall of the light-emitting chip;
   a colloid located in the gaps on the surface of the substrate and surrounds the light emitters, wherein a top surface of the colloid is lower than a top surface of each of the light emitters, the wavelength conversion layer is located between the light-emitting chip and the colloid, and a wavelength of a light emitted by the sidewall of the light-emitting chip is converted by the wavelength conversion layer before being transmitted to the colloid for diffusion;
   an optical film located above the colloid and the light emitters, wherein an air gap is between the optical film and a top surface of each of the wavelength conversion layer; and
   a liquid crystal panel located above the optical film.

2. The display device of claim 1, wherein an optical distance in a range from 0 mm to 1 mm is between the optical film and the top surface of each of the wavelength conversion layer, and the optical distance is smaller than a distance between the optical film and the top surface of the colloid.

3. The display device of claim 1, further comprising:
   a flexible circuit board located on the substrate and electrically connected to the light emitters.

4. The display device of claim 1, wherein the colloid comprises:
   a plurality of optical particles, wherein the material of the optical particles comprises silicon or epoxy resin, and the particle diameter of the optical particles is in a range from 5 μm to 10 μm, and the weight percentage concentration of the optical particles is in a range from 25% to 30%; and
   an optical adhesive, wherein the material of the optical adhesive comprises silicon or poly(methyl methacrylate).

5. A manufacturing method of a display device, comprising steps of:
   mixing a plurality of optical particles with an optical adhesive to form a colloid;
   coating the colloid in a plurality of gaps between a plurality of light emitters on a surface of a substrate, such that the colloid surrounds the light emitters, and a top surface of the colloid is lower than a top surface of each of the light emitters wherein each of the light emitters comprises a light-emitting chip and a wavelength conversion layer covering the light-emitting chip, the wavelength conversion layer is located between the light-emitting chip and the colloid and the wavelength conversion layer extends to a sidewall of the light-emitting chip, such that a wavelength of a light emitted by the sidewall of the light-emitting chip is converted by the wavelength conversion layer before being transmitted to the colloid for diffusion;

disposing an optical film above the colloid and the light emitters, such that an air cap is between the optical film and a top surface of each of the wavelength conversion layer; and disposing a liquid crystal panel above the optical film.

6. The manufacturing method of the display device of claim 5, further comprising:

packaging a plurality of light-emitting chips with a plurality of wavelength conversion layers to form the light emitters; and connecting the light emitters to a flexible circuit board.

7. The manufacturing method of the display device of claim 5, wherein the material of the optical particles comprises silicon or epoxy resin, and the material of the optical adhesive comprises silicon or poly(methyl methacrylate).

8. The manufacturing method of the display device of claim 5, wherein the particle diameter of the optical particles is in a range from 5 μm to 10 μm, and the weight percentage concentration of the optical particles is in a range from 25% to 30%.

* * * * *